(12) United States Patent
Kobayashi et al.

(10) Patent No.: US 11,456,707 B2
(45) Date of Patent: Sep. 27, 2022

(54) POWER AMPLIFIER CIRCUIT

(71) Applicant: Murata Manufacturing Co., Ltd., Kyoto (JP)

(72) Inventors: Shunsuke Kobayashi, Kyoto (JP); Takayuki Kawano, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 297 days.

(21) Appl. No.: 16/724,894

(22) Filed: Dec. 23, 2019

(65) Prior Publication Data

US 2020/0212849 A1 Jul. 2, 2020

(30) Foreign Application Priority Data

Dec. 28, 2018 (JP) .............................. JP2018-246803

(51) Int. Cl.
*H03F 3/04* (2006.01)
*H03F 1/30* (2006.01)
(Continued)

(52) U.S. Cl.
CPC ............. *H03F 1/30* (2013.01); *H03F 1/0211* (2013.01); *H03F 1/32* (2013.01); *H03F 3/213* (2013.01);
(Continued)

(58) Field of Classification Search
CPC . H03F 3/04; H03F 3/195; H03F 3/213; H03F 2200/447
(Continued)

(56) References Cited

U.S. PATENT DOCUMENTS 6,775,525 B1 8/2004 Tanoue et al.
10,014,886 B2 7/2018 Whittaker et al.
(Continued)

FOREIGN PATENT DOCUMENTS

JP 2001-196865 A 7/2001
JP 2007-221490 A 8/2007
(Continued)

OTHER PUBLICATIONS

Notice of Reasons for Refusal for JP Patent Application No. 2018-246803, dated Mar. 23, 2021.

*Primary Examiner* — Henry Choe
(74) *Attorney, Agent, or Firm* — Pearne & Gordon LLP (57) ABSTRACT

A power amplifier circuit includes a power amplifier that amplifies the power of a high frequency signal, a power amplifier temperature detector circuit that includes a temperature detection element, the temperature detection element being thermally coupled with the power amplifier, a bias control signal generator circuit that generates a bias control signal for the power amplifier based on a temperature detection signal outputted from the power amplifier temperature detector circuit, and a regulator circuit that stabilizes the temperature detection signal. The power amplifier, the power amplifier temperature detector circuit, and the regulator circuit are formed in a first integrated circuit, and the bias control signal generator circuit is formed in a second integrated circuit. The substrate material (for example, GaAs) of the first integrated circuit has a higher cutoff frequency than the substrate material (for example, SOI) of the second integrated circuit.

20 Claims, 6 Drawing Sheets

(51) Int. Cl.
   *H03F 1/02* (2006.01)
   *H03F 3/213* (2006.01)
   *H03F 3/45* (2006.01)
   *H03F 1/32* (2006.01)
   *H04B 1/04* (2006.01)

(52) U.S. Cl.
   CPC ......... *H03F 3/45* (2013.01); *H03F 2200/451* (2013.01); *H03F 2200/468* (2013.01); *H03F 2203/45156* (2013.01); *H04B 1/04* (2013.01)

(58) Field of Classification Search
   USPC ........................................ 330/289, 296, 307
   See application file for complete search history.

(56) References Cited

U.S. PATENT DOCUMENTS

| | | | |
|---|---|---|---|
| 10,056,874 B1 | 8/2018 | Ranta et al. | |
| 2007/0194852 A1 | 8/2007 | Tsuromaki et al. | |
| 2017/0170789 A1 | 6/2017 | Sasaki | |
| 2018/0115287 A1* | 4/2018 | Rabjohn | ................ H03F 1/30 |

FOREIGN PATENT DOCUMENTS

| | | |
|---|---|---|
| JP | 2009-118111 A | 5/2009 |
| JP | 2017-112588 A | 6/2017 |

* cited by examiner

POWER AMPLIFIER CIRCUIT

This application claims priority from Japanese Patent Application No. 2018-246803 filed on Dec. 28, 2018. The content of this application is incorporated herein by reference in its entirety.

BACKGROUND OF THE DISCLOSURE

1. Field of the Disclosure

The present disclosure relates to a power amplifier circuit that amplifies the power of a high frequency signal.

2. Description of the Related Art

For example, radio wave communication equipment includes a power amplifier circuit that amplifies the power of a transmitting signal and outputs the amplified transmitting signal to an antenna.

The amplification factor of an amplifier that amplifies the power of a transmitting signal is temperature dependent, and this amplification factor changes with time because of the heat generated by the power amplifier itself. U.S. Pat. No. 10,056,874 (Patent document 1) describes a circuit that compensates an appropriate amplification factor depending on the heat generated by the power amplifier itself.

A temperature compensation circuit of the patent document 1 is configured in such a manner as to detect the heat at a reference temperature of a power amplifier, generate a voltage signal corresponding to a temperature increase after the detection of the reference temperature, and control the amplification factor of the power amplifier by changing a bias voltage for a transistor of the power amplifier using this voltage signal.

BRIEF SUMMARY OF THE DISCLOSURE

For example, in a communication circuit for wireless LAN, a power amplifier circuit that amplifies the power of a transmitting signal and a temperature compensation circuit described in the patent document 1 are formed in a single semiconductor chip.

However, when the foregoing temperature compensation circuit is formed, a Si-based substrate that facilitates microfabrication is used in many cases. In the case where a power amplifier circuit is formed in the same semiconductor chip including such a temperature compensation circuit, there is an issue of insufficient linearity of the power amplifier circuit in a high frequency band such as, for example, the 5 GHz band for wireless LAN because the cutoff frequency f(t) of the Si-based substrate is rather low.

Thus, an object of the present disclosure is to provide a power amplifier circuit that facilitates the suppression of degradation of linearity of amplification characteristics while suppressing degradation of gain associated with increase of temperature.

A power amplifier circuit, which serves as one example of the present disclosure, includes: a power amplifier that amplifies power of a high frequency signal; a temperature detector circuit configured to detect a temperature of the power amplifier; a bias control signal generator circuit that generates a bias control signal for the power amplifier based on a temperature detection signal outputted from the temperature detector circuit; and a regulator circuit that stabilizes the temperature detection signal, wherein the power amplifier, the temperature detector circuit, and the regulator circuit are in a first integrated circuit, and the bias control signal generator circuit is in a second integrated circuit.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

First, several aspects of a power amplifier circuit according to the present disclosure are described. Reference numbers and letters in parentheses correspond to numbers and letters in the drawings described below.

A power amplifier circuit of a first aspect according to the present disclosure includes: a power amplifier (PA) that amplifies power of a high frequency signal; a temperature detector circuit (101) that includes a temperature detection element, the temperature detection element detecting a temperature of the power amplifier; a bias control signal generator circuit (21) that generates a bias control signal for the power amplifier based on a temperature detection signal outputted from the temperature detector circuit; and a regulator circuit (12) that stabilizes the temperature detection signal (stabilizes and provides the temperature detection signal to the power amplifier as a bias voltage), wherein the power amplifier, the temperature detection element, and the regulator circuit are formed in a first integrated circuit (10), and the bias control signal generator circuit is formed in a second integrated circuit (20).

According to the foregoing configuration, the gain that decreases with increase of temperature is compensated, and linearity of the power amplifier is maintained.

In a power amplifier circuit of a second aspect according to the present disclosure, the regulator circuit includes a current mirror circuit formed by connecting control terminals of an input transistor (Q11) and an output transistor (Q12) and a first transistor, at least one of a first terminal and a second terminal of the first transistor being connected to a current path of the input transistor, a control terminal of the first transistor being connected to a current path of the output transistor. A gain adjusting signal supplied from the first integrated circuit to the second integrated circuit passes through wiring connecting the first integrated circuit and the second integrated circuit. Although there is a risk that noise may be superimposed on the gain adjusting signal, the noise component is suppressed by the functions of the current mirror circuit and the current control transistor circuit having the foregoing configurations. This enables to achieve a stable gain compensation appropriate to the temperature of the power amplifier.

In a power amplifier circuit of a third aspect according to the present disclosure, the regulator circuit further includes a second transistor (Q22) having a first terminal, a second terminal, and a control terminal, the first terminal and the second terminal of the second transistor are inserted in the current path of the input transistor (Q11), the first terminal and the second terminal of the first transistor are connected between the first terminal and the control terminal of the second transistor, and the power amplifier includes a power amplifier transistor and a bias transistor (Q31, Q41, Q51) that applies a bias voltage to a control terminal of the power amplifier transistor. Further, the second transistor is a transistor of same type as the bias transistor. According to this configuration, the characteristic variation of transistor due to manufacturing variations is suppressed according to the characteristic deviations of the second transistor and the bias transistor. In other words, even in the case where there is a characteristic variation of transistor due to manufacturing variations, an appropriate compensation of the gain associated with the temperature increase is achieved.

In a power amplifier circuit of a fourth aspect according to the present disclosure, a power supply voltage to be applied to the second transistor is same voltage as a power supply voltage to be applied to the bias transistor. According to this configuration, operation states of the second transistor and the bias transistor become closer to each other, and thus the second transistor and the bias transistor operate more similarly to each other. This enables to cancel out characteristic variations (deviation) of transistors caused by manufacturing variations more precisely. In other words, even in the case where there is a characteristic variation of transistor due to manufacturing variations, a more appropriate compensation of the gain associated with the temperature increase is achieved.

In a power amplifier circuit of a fifth aspect according to the present disclosure, the power amplifier includes a power amplifier transistor (Q30), a bias transistor (Q31, Q41, Q51) that applies a bias voltage to a control terminal of the power amplifier transistor, and a series circuit of a diode-connected circuit of a first bias compensation transistor (Q32, Q42, Q52) and a diode-connected circuit of a second bias compensation transistor (Q33, Q43, Q53), the series circuit being connected between a control terminal of the bias transistor and a reference potential, wherein the first bias compensation transistor is a transistor of same type as the bias transistor, and the second bias compensation transistor is a transistor of same type as the power amplifier transistor. According to this configuration, even in the case where a threshold voltage (Vp) of the bias transistor or the power amplifier transistor varies due to manufacturing variations, variation of the bias voltage is suppressed, and an appropriate compensation of the gain associated with the temperature increase is achieved.

In a power amplifier circuit of a sixth aspect according to the present disclosure, a substrate of the first integrated circuit is a SiGe substrate or a GaAs substrate, and a substrate of the second integrated circuit is a SOI substrate or a Si substrate. According to this configuration, the power amplifier, the temperature detection element, and the regulator circuit enables to maintain linearity of the power amplifier circuit in a high frequency band such as, for example, the 5 GHz band for wireless LAN or the like. Therefore, the bias control signal generator circuit can be configured using a highly integrated low-cost integrated circuit.

In a power amplifier circuit of a seventh aspect according to the present disclosure, the bias control signal generator circuit includes a differential amplifier circuit (OP), a first input terminal of the differential amplifier circuit being connected to the temperature detector circuit, a capacitor (C) connected to a second input terminal of the differential amplifier circuit, and a switch (SW) connected to an output of the differential amplifier circuit, the switch switching between a state where an output voltage of the differential amplifier circuit is applied to the capacitor for charging and a state where the output voltage of the differential amplifier circuit is outputted to the regulator circuit as the bias control signal. This configuration facilitates the obtaining of the bias control signal determined based on the temperature increase of the power amplifier.

In a power amplifier circuit of an eighth aspect according to the present disclosure, the temperature detector circuit includes a series connection circuit (SC) of the temperature detection element Q0) and a first resistance element (R1), a current bypass circuit (11) including a bipolar type current bypass transistor (Q1), the current bypass circuit being thermally coupled with the power amplifier and connected in parallel to the temperature detection element to allow a bypass current to flow, and a resistance voltage divider circuit (VD) that generates a bias voltage for the current bypass transistor, wherein the temperature detection signal is outputted from a connecting part of the temperature detection element and the first resistance element.

According to the foregoing configuration, a current flowing through the current bypass circuit is generated separately from the current flowing through the temperature detection element. This current flowing through the current bypass circuit increases with the temperature of the power amplifier, and therefore the current flowing through the temperature detection element does not increase as much as this current would increase with increase of temperature. Accordingly, as the ambient temperature increases, the ratio of the increase of the amplification factor associated with increase of temperature becomes greater. Because of this, compared with the configuration without the foregoing current bypass circuit, an appropriate compensation of the amplification factor is achieved in a wide range of ambient temperature.

A plurality of embodiments for implementing the present disclosure is described hereinafter with several specific examples while referring to the drawings. Same reference numbers and letters designate same parts throughout the several drawings. In consideration of illustration of points and facilitation of understanding, the description of embodiments is divided for the sake of convenience. However, configuration elements illustrated in different embodiments may be partially substituted or combined. In the description of the second and subsequent embodiments, the descriptions regarding the matters common to the first embodiment will not be repeated, and only the points different from the first embodiment will be described. In particular, similar functions and effects produced by similar configuration elements will not be repeated in every embodiment.

First Embodiment

Figure 1:
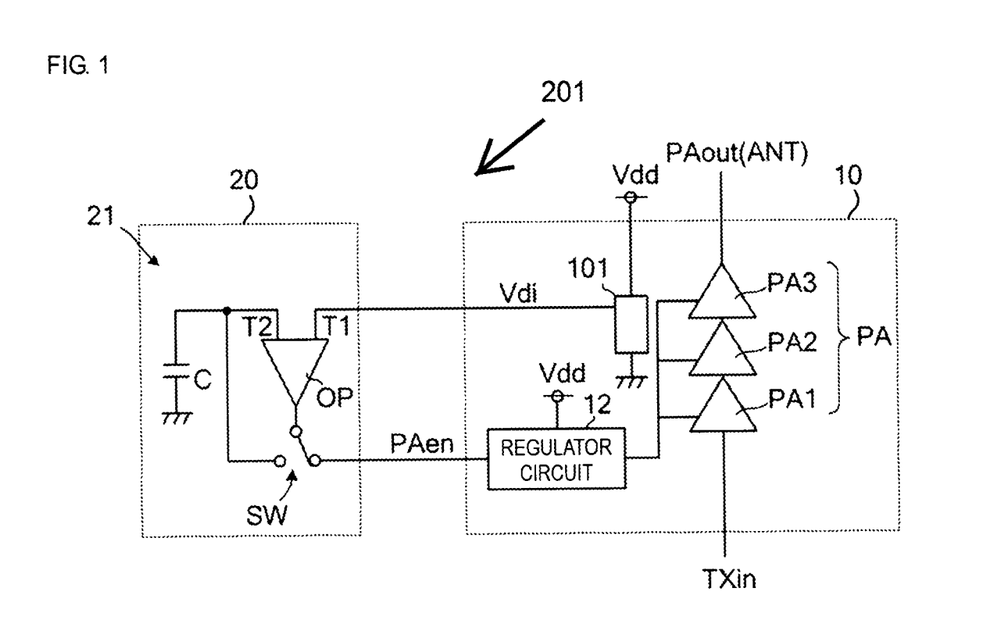
FIG. 1 is a circuit diagram of a power amplifier circuit according to a first embodiment.

FIG. 1 is a circuit diagram of a power amplifier circuit 201 according to the first embodiment. The power amplifier circuit 201 includes a power amplifier PA, a regulator circuit 12 that receives a bias control signal PAen and supplies a bias voltage to the power amplifier PA, a power amplifier temperature detector circuit 101, and a bias control signal generator circuit 21 that receives a temperature detection signal Vdi and generates the bias control signal PAen for the regulator circuit 12.

The power amplifier PA, the power amplifier temperature detector circuit 101, and the regulator circuit 12 are formed in a first integrated circuit 10. The bias control signal generator circuit 21 is formed in a second integrated circuit 20.

The substrate material of the first integrated circuit 10 is a material having a cutoff frequency higher than that of the substrate material of the second integrated circuit 20. For example, the substrate of the first integrated circuit 10 is a SiGe substrate or a GaAs substrate, and the substrate of the second integrated circuit 20 is a silicon-on-insulator (SOI) substrate or a Si substrate.

The power amplifier PA is made up of a first stage power amplifier PA1, a second stage power amplifier PA2, and a third stage power amplifier PA3, which are sequentially cascade-connected. The power amplifier PA amplifies the power of a transmitting signal, which is inputted to a transmitting signal input terminal TXin, and outputs a resulting signal from an output terminal PAout. The output terminal PAout is, for example, directly or indirectly connected to an antenna.

The power amplifier temperature detector circuit 101 is thermally coupled to the power amplifier PA and generates the temperature detection signal Vdi corresponding to the temperature of the power amplifier PA. In other words, the power amplifier temperature detector circuit 101 receives (detects) the heat generated at the power amplifier PA and generates the temperature detection signal Vdi corresponding to the temperature of the power amplifier PA.

The bias control signal generator circuit 21 is a circuit that outputs the bias control signal PAen to the power amplifier PA, based on the temperature detection signal Vdi. The bias control signal generator circuit 21 includes an operational amplifier OP, a capacitor C, and a switch SW. The power amplifier temperature detector circuit 101 is connected to a first input terminal T1 of the operational amplifier OP, and the capacitor C is connected to a second input terminal T2 of the operational amplifier OP. The switch SW is connected to an output of the operational amplifier OP and switches between the state where the output voltage of the operational amplifier OP is used for charging the capacitor C and the state where the output voltage of the operational amplifier OP is outputted to the regulator circuit 12 as the bias control signal PAen.

First, at the start of operation of the power amplifier PA, the switch SW is in the state where the output voltage of the operational amplifier OP is used for charging the capacitor C. In other words, the capacitor C is charged with the voltage of the temperature detection signal Vdi inputted to the first input terminal T1 from the power amplifier temperature detector circuit 101 at the start of operation of the power amplifier PA. This voltage of the temperature detection signal Vdi serves as the voltage indicating a reference temperature at the start of operation of the power amplifier PA. Next, the switch SW is turned to the state where the output voltage of the operational amplifier OP is outputted to the power amplifier PA as the bias control signal PAen. In other words, after the start of operation of the power amplifier PA, the output voltage of the operational amplifier OP is outputted to the power amplifier PA as the bias control signal PAen. This output voltage of the operational amplifier is a result of comparison between the voltage of the temperature detection signal Vdi at each time input from the first input terminal T1 of the operational amplifier OP and the voltage indicating the reference temperature, which charged the capacitor C and is inputted from the second input terminal T2.

The more the voltage of the foregoing bias control signal PAen increases, the higher the amplification factor of the power amplifier PA becomes. Therefore, the foregoing configuration and functions enable the power amplifier PA to be controlled in such a way that a decrease of the amplification factor of the power amplifier PA associated with increase of temperature is suppressed and that an appropriate amplification factor is maintained. The operational amplifier OP corresponds to a "differential amplifier circuit" according to the present disclosure.

As illustrated in FIG. 1, the substrate of the first integrated circuit 10 is a SiGe substrate or a GaAs substrate. Therefore, the power amplifier, the temperature detection element, and the regulator circuit can maintain linearity of the power amplifier circuit in a high frequency band such as, for example, the 5 GHz band for wireless LAN or the like. Further, the substrate of the second integrated circuit 20 is a SOI substrate or a Si substrate. Therefore, the bias control signal generator circuit can be formed using a highly integrated low-cost integrated circuit.

Next, configuration examples of the foregoing regulator circuit 12 and the power amplifier PA are illustrated.

Figure 2A:
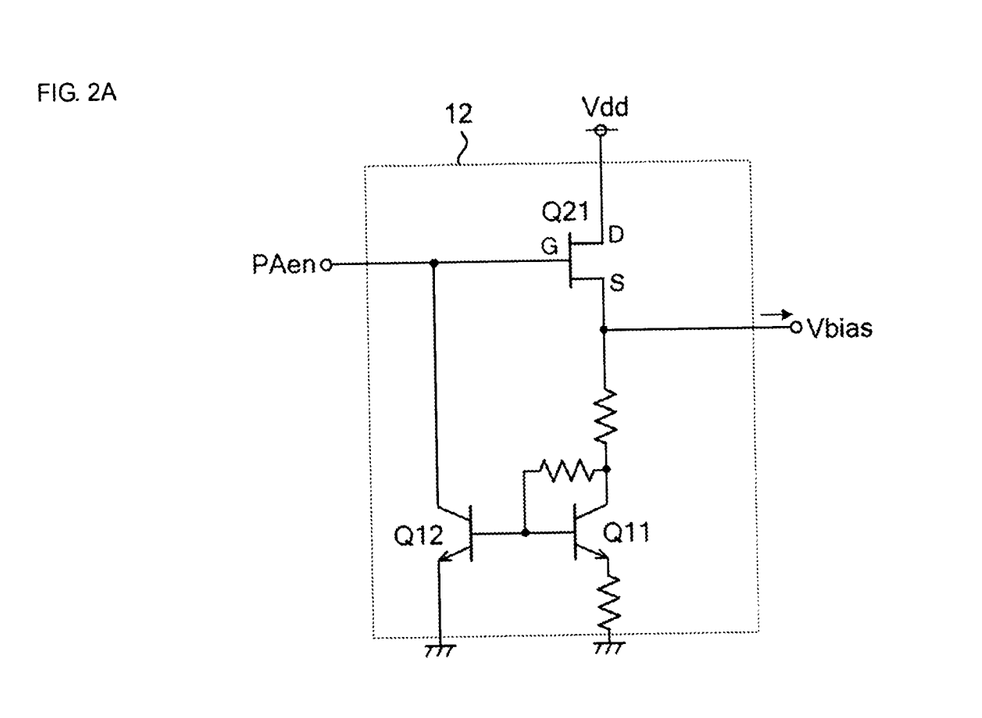
FIG. 2A are circuit diagrams of a regulator circuit.
Figure 2B:
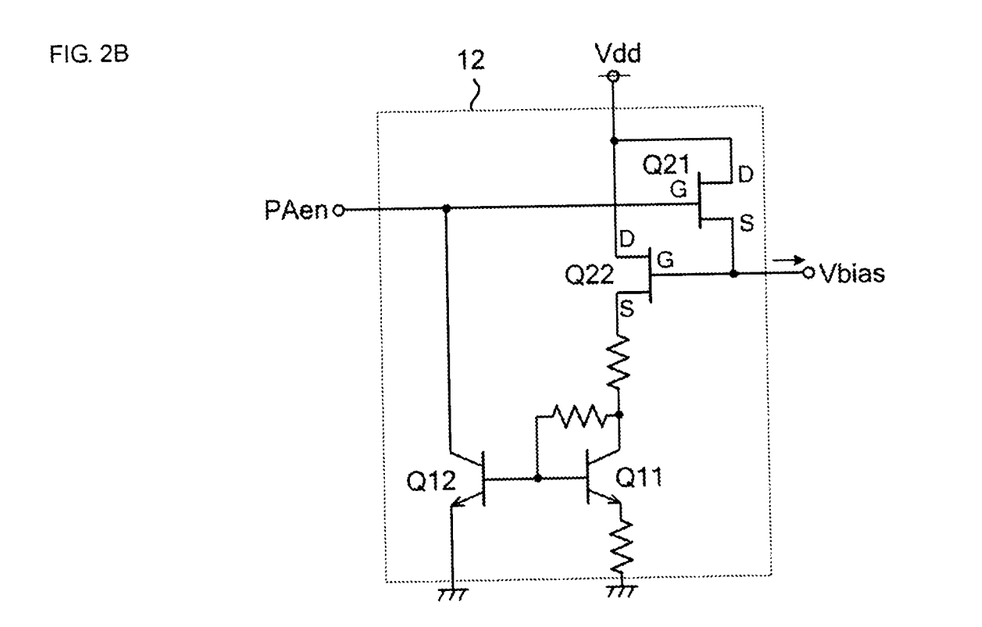

FIG. 2A and FIG. 2B are circuit diagrams of the regulator circuit 12. In FIG. 2A, the regulator circuit 12 forms a current mirror circuit including an input transistor Q11 and an output transistor Q12. The transistor Q11 is a transistor provided on an input-side current path, and the transistor Q12 is a transistor provided on an output-side current path. In other words, a collector and an emitter of the transistor Q11 are provided on the input-side current path, and a collector and an emitter of the transistor Q12 are provided on the output-side current path. A transistor Q21 is connected in series to the input-side current path. Specifically, a terminal of at least one of a source S and a drain D of the transistor Q21 is connected to the input-side current path, and a gate G of the transistor Q21 is connected to the output-side current path. The control signal PAen is inputted to the gate G of the transistor Q21, and a bias voltage Vbias for the power amplifier is outputted from the source S of the transistor Q21.

The drain D and the source S of the transistor Q21 correspond to a "first terminal of a first transistor" and a "second terminal of the first transistor" according to the present disclosure, and the gate G of the transistor Q21 corresponds to a "control terminal of the first transistor" according to the present disclosure. In the regulator circuit illustrated in FIG. 2A, a control voltage of the transistor Q21, which controls a current in the input-side current path, is controlled by negative feedback using a current flowing the output-side current path. This suppresses voltage variation of the bias voltage Vbias associated with voltage variation of the control signal PAen and variation of a power supply voltage inputted to a power supply voltage input terminal Vdd.

The regulator circuit 12 illustrated in FIG. 2B is a circuit in which a transistor Q22 is added to the circuit illustrated in FIG. 2A. In FIG. 2B, the transistor Q22 is connected in series to the input-side current path. Further, the drain and the source (D-S) of the transistor Q21 are connected between the drain and the gate (D-G) of the transistor Q22.

The regulator circuit 12 is configured in such a way that the control signal PAen is inputted to the gate G of the transistor Q21 and that the bias voltage Vbias for the power amplifier is outputted from the source S of the transistor Q21.

The drain D and the source S of the transistor Q22 correspond to a "first terminal of a second transistor" and a "second terminal of the second transistor" according to the present disclosure, and the gate G of the transistor Q22 corresponds to a "control terminal of the second transistor" according to the present disclosure.

In the configuration illustrated in FIG. 2B, the control voltage of the transistor Q21, which controls the current in the input-side current path, is also controlled by negative feedback using the current flowing the output-side current path. This suppresses the voltage variation of the bias voltage Vbias associated with the voltage variation of the control signal PAen and the variation of the power supply voltage inputted to the power supply voltage input terminal Vdd. Advantageous effects of connecting the transistor Q22 will be described below with reference to FIG. 4, FIG. 5, and the like.

The transistor Q21 corresponds to the "first transistor" according to the present disclosure, and the transistor Q22 corresponds to the "second transistor" according to the present disclosure.

In FIG. 2A, when the control signal PAen outputted from the bias control signal generator circuit 21 illustrated in FIG. 1 is inputted to the gate of the transistor Q21, the transistor Q21 becomes electrically continuous by the voltage of the control signal PAen, and a current corresponding to the voltage of the control signal PAen flows into a current path of the input transistor Q11. Further, a current of mirror output flows into the output transistor Q12.

In FIG. 2B, when the control signal PAen outputted from the bias control signal generator circuit 21 illustrated in FIG. 1 is inputted to the gate of the transistor Q21, the transistors Q21 and Q22 become electrically continuous by the voltage of the control signal PAen, and a current corresponding to the voltage of the control signal PAen flows into a current path of the input transistor Q11. Further, a current of mirror output flows through the output transistor Q12.

In this way, the current mirror circuit outputs the voltage of the stabilized PAen as Vbias. Therefore, even in the case where the power supply voltage of the power supply voltage input terminal Vdd varies, the stabilized bias voltage Vbias corresponding to the voltage of PAen is generated.

Figure 3:
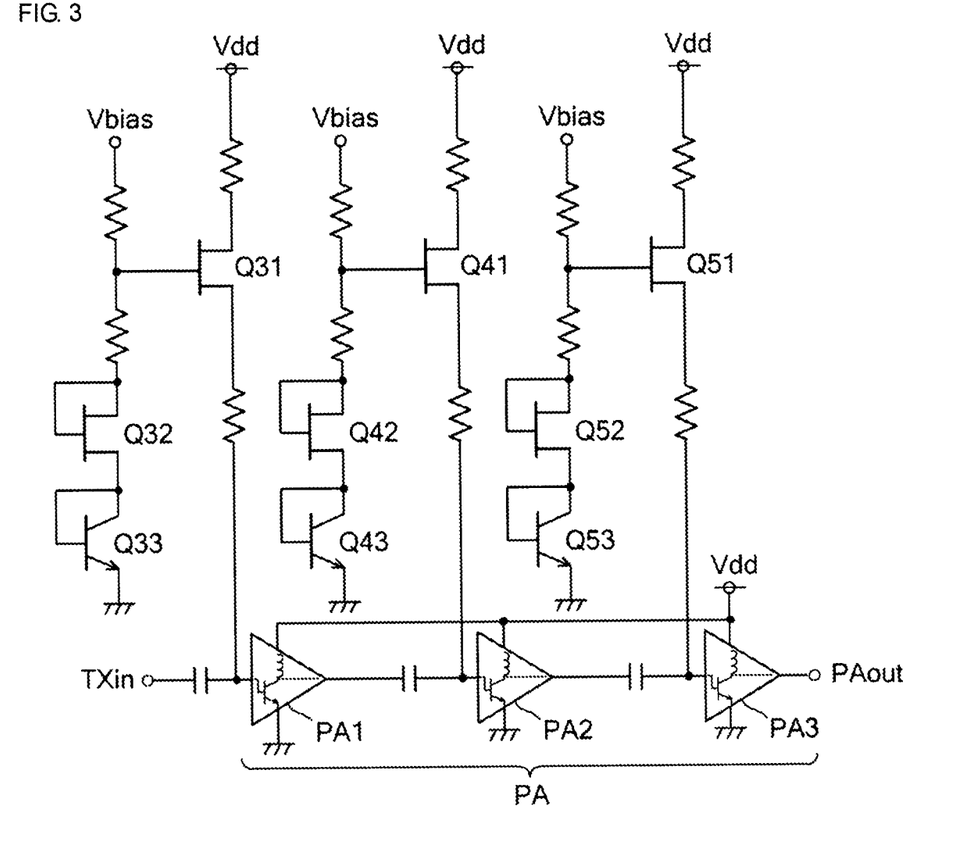
FIG. 3 is a circuit diagram of a power amplifier and a bias circuit thereof.

FIG. 3 is a circuit diagram of the power amplifier PA and a bias circuit thereof. The power amplifier PA is made up of a first stage power amplifier PA1, a second stage power amplifier PA2, and a third stage power amplifier PA3. In FIG. 3, the internal configuration of each of the power amplifiers PA1, PA2, and PA3 is represented by a single transistor symbol. The power amplifier PA amplifies the power of a transmitting signal, which is inputted to the transmitting signal input terminal TXin, and outputs a resulting signal from the output terminal PAout.

A bias circuit including transistors Q31, Q32, and Q33 is connected to the first stage power amplifier PA1. The transistor Q31 is a bias transistor. The transistors Q32 and Q33 are a compensation circuit for the bias transistor Q31 and the power amplifier PA1. The transistors Q32 and Q33 are connected between a gate (control terminal) of the bias transistor Q31 and ground (reference potential). The transistor Q32 forms a diode-connected circuit in which a drain and a gate of the transistor Q32 are connected to each other.

Similarly, the transistor Q33 forms a diode-connected circuit in which a collector and a base of the transistor Q33 are connected to each other.

Similarly, a bias circuit including transistors Q41, Q42, and Q43 is connected to the second stage power amplifier PA2, and a bias circuit including transistors Q51, Q52, and Q53 is connected to the third stage power amplifier PA3.

The foregoing bias voltage Vbias is applied to each of the first, second and third stage power amplifiers PA1, PA2, and PA3. To be precise, voltages obtained by subtracting gate-source voltages of the transistors Q31, Q41, and Q51 from the bias voltage Vbias are applied to the power amplifiers PA1, PA2, and PA3 as the bias voltages, respectively.

As described above, the first integrated circuit 10 and the second integrated circuit 20 are different chips. Therefore, there is a signal path located outside the chips and connecting the first integrated circuit 10 and the second integrated circuit 20. Therefore, there is a possibility that this signal path located outside the chips comes under the influence of an external disturbance. However, as described above, in the regulator circuit 12 in the first integrated circuit 10, the voltage variation of the bias voltage Vbias associated with the voltage variation of the control signal PAen is suppressed. Therefore, even in the case where there is an external disturbance on the control signal PAen, a stabilized bias voltage Vbias in which the influence of the external disturbance is suppressed is generated. Therefore, the present embodiment is less susceptible to the influence of the foregoing external disturbance.

Figure 4:
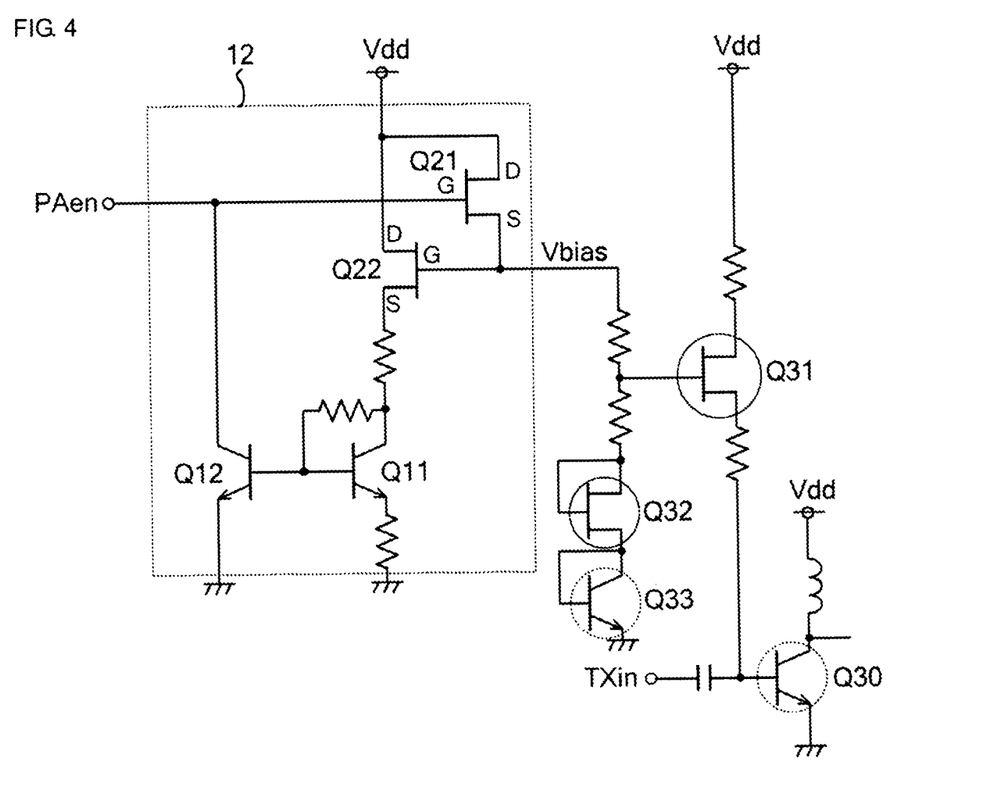
FIG. 4 depicts, in one drawing, the regulator circuit illustrated in FIG. 2B and part of the power amplifier and the bias circuit thereof illustrated in FIG. 3.
Figure 5:
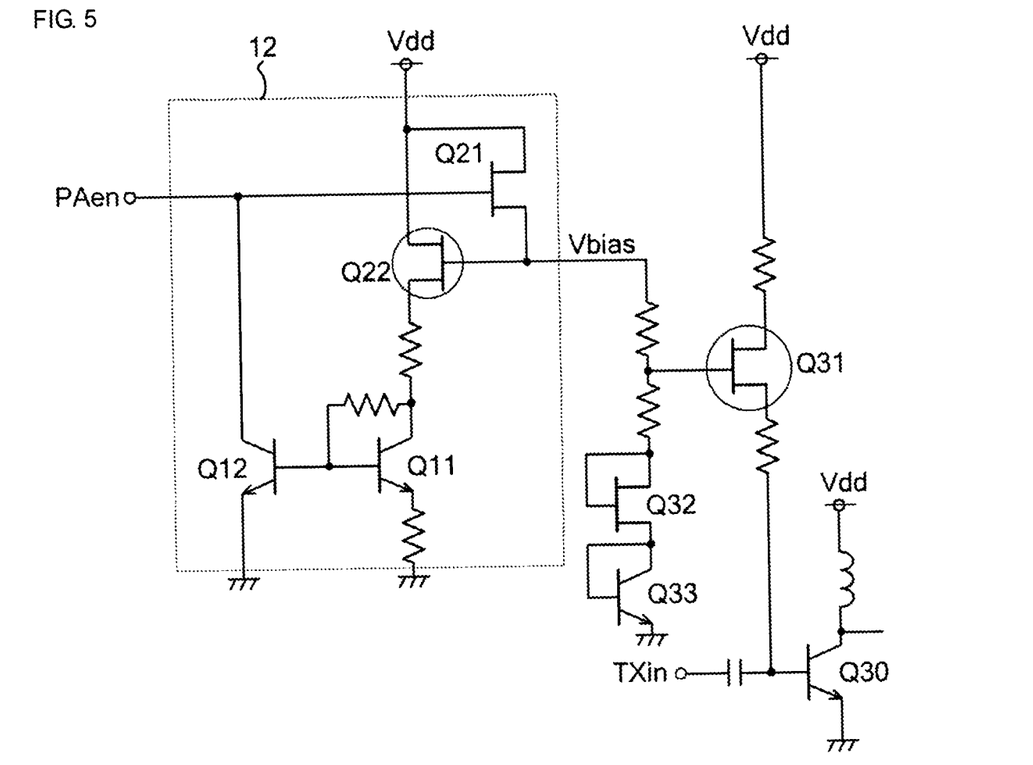
FIG. 5 depicts, in one drawing, the regulator circuit illustrated in FIG. 2B and part of the power amplifier and the bias circuit thereof illustrated in FIG. 3.

FIG. 4 and FIG. 5 each depict, in one drawing, the regulator circuit illustrated in FIG. 2B and part of the power amplifier PA and the bias circuit thereof illustrated in FIG. 3. Here, with regard to the power amplifier, the power amplifier transistor Q30 and the bias circuit thereof in the first stage power amplifier PA1 are illustrated.

In FIG. 4, the bias transistor Q31 and the first bias compensation transistor Q32 are transistors of the same type. Further, the power amplifier transistor Q30 and the second bias compensation transistor Q33 are transistors of the same type. Here, that one transistor and another transistor are "transistors of the same type" means, for example, that both one transistor and another transistor are "bipolar transistors", "n-channel type FETs", "p-channel type FETs", "enhancement type FETs", "depression type FETs", or the like.

In this example, both the bias transistor Q31 and the first bias compensation transistor Q32 are n-channel type MOSFETs. Further, both the power amplifier transistor Q30 and the second bias compensation transistor Q33 are npn-type bipolar transistors. According to this configuration, even in the case where a threshold voltage (Vp) of the bias transistor Q31 or the power amplifier transistor Q30 varies due to manufacturing variations, the direction of a variation of the bias voltage caused by a characteristic variation of the bias transistor Q31 and the direction of a variation of the bias voltage caused by a characteristic variation of the first bias compensation transistor Q32 are the directions that cancel each other out. Therefore, variation of the bias voltage is suppressed, and an appropriate compensation of the gain associated with the temperature increase is achieved. Similarly, the direction of a variation of the bias voltage caused by a characteristic variation of the power amplifier transistor Q30 and the direction of a variation of the bias voltage caused by a characteristic variation of the second bias compensation transistor Q33 are the directions that cancel each other out. Therefore, variation of the bias voltage is suppressed, and an appropriate compensation of the gain associated with the temperature increase is achieved.

In FIG. 5, the second transistor Q22 in the regulator circuit 12 is of the same type as the bias transistor Q31 that applies the bias voltage to the base of the power amplifier transistor Q30. In this example, both the second transistor Q22 and the bias transistor Q31 are n-channel type MOSFETs. According to this configuration, the characteristic variation of transistor due to manufacturing variations is suppressed according to the characteristic deviations of the second transistor Q22 and the bias transistor Q31. In other words, even in the case where there is a characteristic variation of transistor due to manufacturing variations, the direction of gain compensation associated with the temperature increase caused by a characteristic variation of the second transistor Q22 and the direction of gain compensation associated with the temperature increase caused by a characteristic variation of the bias transistor Q31 are the directions that cancel each other out. Therefore, an appropriate compensation of the gain associated with the temperature increase is achieved.

Further, the power supply voltage (voltage at the power supply input terminal Vdd) applied to the second transistor Q22 is substantially equal to the power supply voltage applied to the bias transistor Q31. Accordingly, the characteristic variation of the second transistor Q22 and the characteristic variation of the bias transistor Q31 become more similar to each other. Therefore, the characteristic variation of the second transistor Q22 cancels out the influence of the characteristic variation of the bias transistor Q31 more precisely, and variation of the bias voltage is further suppressed. Therefore, even in the case where there is a characteristic variation of transistor due to manufacturing variations, variation of the bias voltage is suppressed, and an appropriate compensation of the gain associated with the temperature increase is maintained.

In FIG. 4 and FIG. 5, the power amplifier transistor Q30 in the first stage power amplifier PA1 and the bias circuit corresponding thereto are illustrated, and it is preferable that the power amplifier transistors in the second and third stage power amplifiers and the bias circuits corresponding thereto also have relationships of the same type as the one described above.

Figure 6:
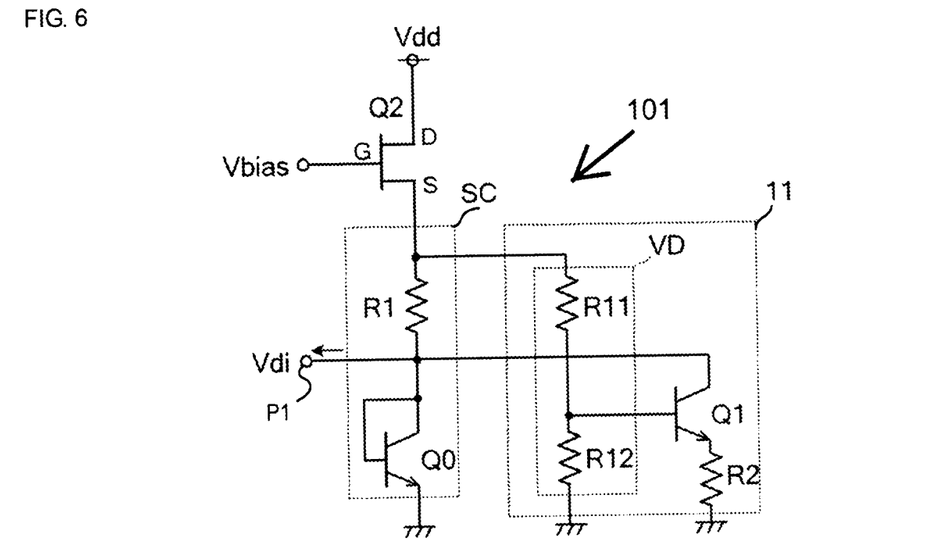
FIG. 6 is a circuit diagram of a power amplifier temperature detector circuit.

Next, a specific configuration example of the foregoing power amplifier temperature detector circuit 101 is described. FIG. 6 is a circuit diagram of the power amplifier temperature detector circuit 101.

The power amplifier temperature detector circuit 101 illustrated in FIG. 6 includes a series connection circuit SC, a transistor Q2, and a current bypass circuit 11. The series connection circuit SC is a series connection circuit of a temperature detector transistor Q0 and a first resistance element R1 connected in series to the temperature detector transistor Q0 and is connected between the power supply voltage input terminal Vdd and the ground. A source S and a gate G of the transistor Q2 are connected in series between the power supply voltage input terminal Vdd and the series connection circuit SC, and the source S and a drain D of the transistor Q2 are connected in series between the series connection circuit SC and the power supply voltage input terminal Vdd. A connecting part of the temperature detector transistor Q0 and the first resistance element R1 is connected to a signal output terminal P1, and the temperature detection signal Vdi is outputted from the signal output terminal P1. In other words, the signal output terminal P1 is connected to a node on a path connecting the temperature detector transistor Q0 and the first resistance element R1. This temperature detector transistor Q0 is a transistor in which a collector and a base of a bipolar type transistor are directly connected to each other, namely, a diode-connected transistor. The temperature detector transistor Q0 corresponds to a "temperature detection element" according to the present disclosure.

The current bypass circuit 11 includes a bipolar type transistor Q1 that is thermally coupled to the power amplifier and allows a bypass current to flow by being connected in parallel to the temperature detector transistor Q0. A second resistance element is connected between an emitter of the transistor Q1 and the ground. The current bypass circuit 11 further includes a resistance voltage divider circuit VD that generates a bias voltage for the transistor Q1. This resistance voltage divider circuit VD is made up of a series circuit of a resistance element R11 and a resistance element R12 and is connected between the power supply voltage input terminal Vdd and the ground. The bias voltage generated by the resistance voltage divider circuit VD is supplied to a control terminal of the first transistor Q1.

The power amplifier temperature detector circuit 101 illustrated in FIG. 6 functions in the following manner.

In FIG. 6, when the ratio of the voltage drop at the resistance value of the first resistance element R1 with respect to the voltage across both ends of the temperature detector transistor Q0 is sufficiently large (the larger), the series connection circuit SC functions as a constant current circuit. In other words, this voltage (temperature detection signal Vdi) outputted from the connecting part of the temperature detector transistor Q0 and the first resistance element R1 changes in accordance with temperature dependence property of the temperature detector transistor Q0. Specifically, the voltage across both ends (namely, the voltage of the temperature detection signal Vdi) of the temperature detector transistor Q0 can be expressed as V=Vg−BT, where Vg is the bandgap voltage, T is the absolute temperature, and B is a coefficient for the absolute temperature. In the case where a current flowing into the temperature detector transistor Q0 is constant, B is a constant number.

In other words, in the state where the current bypass circuit 11 is not present (is not connected), with increase of temperature, the value obtained by subtracting Vg from the voltage V of the temperature detection signal Vdi is proportional to the temperature of the temperature detector transistor Q0.

On the other hand, in the case where the current bypass circuit 11 is present as is the case with the present embodiment, the relationship between the temperature detection signal Vdi and the temperature changes in the following manner.

Because the base bias voltage of the transistor Q1 is constant, the relationship between the collector current of the transistor Q1 and the temperature can be expressed by the following simplified formula:

$$I_C \propto CT^{(4-n)} \exp\left(-\frac{V_{GO}}{V_T}\right) \exp\left(\frac{V_{be}}{V_T}\right)$$

Here, VGO is the absolute zero voltage obtained by linear approximation of the bandgap voltage, VT is the thermal voltage, and Vbe is the base-emitter voltage of the first transistor Q1. Further, C is a constant, and n is a constant that varies depending on the manufacturing process of the first transistor Q1.

Accordingly, as the temperature increases, the bypass current flowing into the transistor Q1 increases, and the current flowing into the temperature detector transistor Q0 decreases accordingly. In other words, the ratio of increase of the voltage of the temperature detection signal Vdi with respect to the actual temperature increase becomes greater.

Because of the foregoing function, the current flowing into the temperature detector transistor Q0 does not increase as much as this current would increase with increase of temperature. Accordingly, as the ambient temperature increases, the ratio of the increase of the amplification factor associated with increase of temperature becomes greater. Because of this, compared with the configuration without the foregoing current bypass circuit, an appropriate compensation of the amplification factor is achieved in a wide range of ambient temperature.

Note that according to the configuration of the power amplifier temperature detector circuit 101, the voltage applied to the series connection circuit SC is the voltage obtained by subtracting the gate-source voltage of the transistor Q2 from the bias voltage Vbias. Therefore, even in the case where the voltage of the power supply voltage input terminal Vdd is not constant, an appropriate temperature detection signal Vdi is outputted so long as the voltage Vbias applied to the gate of the transistor Q2 is constant. Accordingly, even in the case where the power supply voltage varies, a highly precise temperature detection signal is obtained.

Further, in the current bypass circuit 11 of the power amplifier temperature detector circuit 101, a resistance element R2 is connected between the emitter of the transistor Q1 and the ground. This enables to set the inclination of the bypass current flowing via the transistor Q1 with respect to the change of temperature. Further, overcurrent flowing into the transistor Q1 at a high temperature state can be limited.

Figure 7:
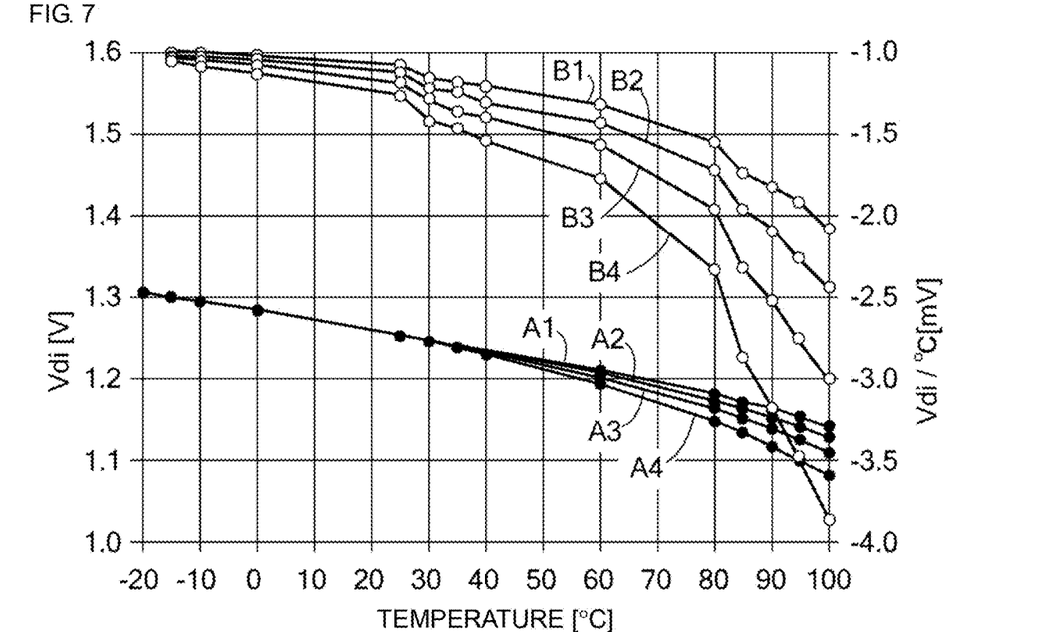
FIG. 7 is a diagram illustrating relationships between temperature of a temperature detector transistor and a temperature detection signal.

FIG. 7 is a diagram illustrating relationships between the temperature of the temperature detector transistor Q0 and the temperature detection signal Vdi. In FIG. 7, the horizontal axis represents the temperature of the power amplifier PA (the temperature detected by the power amplifier temperature detector circuit 101), scale marks on the left-side vertical axis are voltage values of the temperature detection signal Vdi, and scale marks on the right-side vertical axis are values of the change of the temperature detection signal Vdi with respect to the change of temperature (degrees C.). Characteristic lines A1 to A4 in FIG. 7 each depict a relationship between the temperature and the temperature detection signal Vdi. Further, characteristic lines B1 to B4 each depict a relationship between the temperature and the change of voltage value of the temperature detection signal Vdi with respect to the change of temperature. Here, when the respective characteristic lines are obtained, the base bias voltage of the transistor Q1 is set as follows.

| | |
|---|---|
| A1, B1 | 1.84 V |
| A2, B2 | 1.86 V |
| A3, B3 | 1.88 V |
| A4, B4 | 1.9 V |

As described in the above, in the present embodiment, the current bypass circuit 11 is included, and the amount of the bypass current can be changed depending on the temperature of the power amplifier. This increases the change of voltage (inclination) of the temperature detection signal Vdi with respect to the change of temperature as the temperature of the power amplifier becomes higher. Because of this, as the ambient temperature increases, the ratio of the increase of the amplification factor associated with increase of temperature becomes greater, and an appropriate compensation of the amplification factor is achieved in a wide range of ambient temperature compared with the configuration without the foregoing current bypass circuit.

According to the present embodiment, even in the case where the temperature of the power amplifier varies due to the influence of ambient temperature, variation of the amplification factor (gain drift) caused by temperature increase of the power amplifier is suppressed. Accordingly, the gain drift is suppressed across a wide range of ambient temperature.

Figure 8:
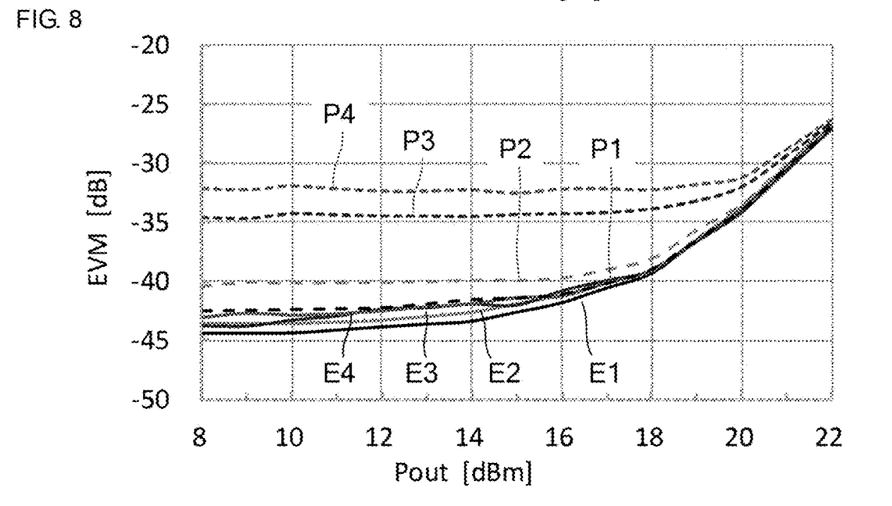
FIG. 8 is a diagram illustrating relationships between error vector magnitude (EVM) and output power of the power amplifier circuit.

FIG. 8 is a diagram illustrating relationships between the error vector magnitude (EVM) and the output power of the power amplifier circuit 201. The horizontal axis of FIG. 8 represents the output power of the power amplifier circuit 201, and the vertical axis represents EVM. In FIG. 8, characteristic lines E1 to E4 are each a characteristic of a power amplifier circuit including the bias control signal generator circuit 21, and characteristic lines P1 to P4 are each a characteristic of a power amplifier circuit not including the bias control signal generator circuit 21. Here, the relationships between the respective characteristic lines and the driving time of the power amplifier are as follows.

| | |
|---|---|
| E1, P1 | 80 µs |
| E2, P2 | 1 ms |
| E3, P3 | 2 ms |
| E4, P4 | 4 ms |

Generally, in vector modulation, a digital bit is transferred to a carrier by changing the amplitude and the phase of a RF carrier in such a manner as to occupy one of preset positions in I-Q plane (constellation diagram) at each data clock. A data symbol is coded by each position, and one data symbol is made up of at least one data bit. In other words, in the case where n data bits are transferred per each symbol, 2n positions are needed. Accordingly, as the number of data bits per each symbol increases, it becomes more important to keep the error vector magnitude (EVM) of a transmitting signal low in order to secure a predetermined communication error rate.

Here, as illustrated in FIG. 8, in the power amplifier circuit not including the bias control signal generator circuit 21, EVM degrades with time since the start of driving of the power amplifier. Whereas, in the power amplifier circuit including the bias control signal generator circuit 21, an appropriate compensation of the gain associated with the temperature increase is achieved, and EVM is kept low, irrespective of time since the start of driving of the power amplifier.

However, when the ambient temperature of the power amplifier becomes high, the change of the voltage of the voltage signal corresponding to the increase of the temperature of the power amplifier and the change of the temperature of the power amplifier itself become nonlinear. Thus, an appropriate compensation of the amplification factor of the power amplifier cannot be achieved in the bias control signal generator circuit 21. As a result, particularly in the environment where the ambient temperature becomes high, EVM is liable to increase.

On the other hand, the use of the power amplifier temperature detector circuit according to the present embodiment enables to increase the ratio of the increase of the amplification factor associated with the temperature increase as the temperature of the power amplifier increases. Therefore, an appropriate compensation of the amplification factor is achieved by the bias control signal generator circuit 21 in a wide range of the temperature. Accordingly, even in the environment where the ambient temperature becomes high, EVM can be kept low.

Lastly, the foregoing descriptions of the embodiments are exemplary in all aspects and are not restrictive. For a person skilled in the art, modifications and alterations are possible if appropriate. The scope of the present disclosure is described by the claims and not by the foregoing embodiments. Furthermore, variations of the embodiments, which come within the scope of the claims and the range of equivalency of the claims, are included in the scope of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
    a power amplifier that amplifies power of a high frequency signal;
    a temperature detector circuit configured to detect a temperature of the power amplifier;
    a bias control signal generator circuit that generates a bias control signal for the power amplifier based on a temperature detection signal outputted from the temperature detector circuit; and
    a regulator circuit that stabilizes the temperature detection signal, wherein
    the power amplifier, the temperature detector circuit, and the regulator circuit are arranged in a first integrated circuit, and
    the bias control signal generator circuit is arranged in a second integrated circuit.

2. The power amplifier circuit according to claim 1, wherein the second integrated circuit is connected to the first integrated circuit by a signal path that is external to both the first integrated circuit and the second integrated circuit.

3. The power amplifier circuit according to claim 1, wherein a substrate material of the first integrated circuit has a cutoff frequency higher than the cutoff frequency of a substrate material of the second integrated circuit.

4. The power amplifier circuit according to claim 1, wherein
    the regulator circuit includes
        a current mirror circuit comprising an input transistor and an output transistor, wherein control terminals of the input transistor are connected to control terminals of the output transistor, and
        a first transistor, at least one of a first terminal or a second terminal of the first transistor being connected to a current path of the input transistor, and a control terminal of the first transistor being connected to a current path of the output transistor.

5. The power amplifier circuit according to claim 2, wherein
    the regulator circuit includes
        a current mirror circuit comprising an input transistor and an output transistor, wherein control terminals of the input transistor are connected to control terminals of the output transistor, and
        a first transistor, at least one of a first terminal or a second terminal of the first transistor being connected to a current path of the input transistor, and a control terminal of the first transistor being connected to a current path of the output transistor.

6. The power amplifier circuit according to claim 4, wherein
    the regulator circuit further includes a second transistor having a first terminal, a second terminal, and a control terminal,
    the first terminal and the second terminal of the second transistor are inserted in the current path of the input transistor,
    the first terminal and the second terminal of the first transistor are connected between the first terminal and the control terminal of the second transistor,
    the power amplifier includes a power amplifier transistor and a bias transistor that applies a bias voltage to a control terminal of the power amplifier transistor, and
    the second transistor and the bias transistor are a same type of transistor.

7. The power amplifier circuit according to claim 6, wherein a power supply voltage applied to the second transistor is same voltage as a power supply voltage to be applied to the bias transistor.

8. The power amplifier circuit according to claim 1, wherein
    the power amplifier includes
        a power amplifier transistor,
        a bias transistor that applies a bias voltage to a control terminal of the power amplifier transistor, and
        a series circuit of a diode-connected circuit of a first bias compensation transistor and a diode-connected circuit of a second bias compensation transistor, the series circuit being connected between a control terminal of the bias transistor and a reference potential, wherein
    the first bias compensation transistor is a transistor of same type as the bias transistor, and
    the second bias compensation transistor is a transistor of same type as the power amplifier transistor.

9. The power amplifier circuit according to claim 3, wherein
    the power amplifier includes
        a power amplifier transistor,
        a bias transistor that applies a bias voltage to a control terminal of the power amplifier transistor, and
        a series circuit of a diode-connected circuit of a first bias compensation transistor and a diode-connected circuit of a second bias compensation transistor, the series circuit being connected between a control terminal of the bias transistor and a reference potential, wherein
    the first bias compensation transistor is a transistor of same type as the bias transistor, and
    the second bias compensation transistor is a transistor of same type as the power amplifier transistor.

10. The power amplifier circuit according to claim 1, wherein
    a substrate of the first integrated circuit is a SiGe substrate or a GaAs substrate, and
    a substrate of the second integrated circuit is a SOI substrate or a Si substrate.

11. The power amplifier circuit according to claim 3, wherein
    a substrate of the first integrated circuit is a SiGe substrate or a GaAs substrate, and
    a substrate of the second integrated circuit is a SOI substrate or a Si substrate.

12. The power amplifier circuit according to claim 4, wherein
 a substrate of the first integrated circuit is a SiGe substrate or a GaAs substrate, and
 a substrate of the second integrated circuit is a SOI substrate or a Si substrate.

13. The power amplifier circuit according to claim 1, wherein
the bias control signal generator circuit includes
 a differential amplifier circuit, a first input terminal of the differential amplifier circuit being connected to the temperature detector circuit,
 a capacitor connected to a second input terminal of the differential amplifier circuit, and
 a switch connected to an output of the differential amplifier circuit, the switch configured to switch between a state where an output voltage of the differential amplifier circuit charges the capacitor and a state where the output voltage of the differential amplifier circuit is outputted to the regulator circuit as the bias control signal.

14. The power amplifier circuit according to claim 4, wherein
the bias control signal generator circuit includes
 a differential amplifier circuit, a first input terminal of the differential amplifier circuit being connected to the temperature detector circuit,
 a capacitor connected to a second input terminal of the differential amplifier circuit, and
 a switch connected to an output of the differential amplifier circuit, the switch configured to switch between a state where an output voltage of the differential amplifier circuit charges the capacitor and a state where the output voltage of the differential amplifier circuit is outputted to the regulator circuit as the bias control signal.

15. The power amplifier circuit according to claim 1, wherein
the temperature detector circuit includes
 a series connection circuit including a temperature detection element and a first resistance element, and
 a current bypass circuit including:
  a bipolar type current bypass transistor, the current bypass circuit being connected in parallel to the temperature detection element and allowing a bypass current to flow, and
  a resistance voltage divider circuit that generates a bias voltage for the current bypass transistor, and
the temperature detection signal is outputted from a connecting part of the temperature detection element and the first resistance element.

16. The power amplifier circuit according to claim 3, wherein
the temperature detector circuit includes
 a series connection circuit including a temperature detection element and a first resistance element, and
 a current bypass circuit including:
  a bipolar type current bypass transistor, the current bypass circuit being connected in parallel to the temperature detection element and allowing a bypass current to flow, and
  a resistance voltage divider circuit that generates a bias voltage for the current bypass transistor, and
the temperature detection signal is outputted from a connecting part of the temperature detection element and the first resistance element.

17. The power amplifier circuit according to claim 4, wherein
the temperature detector circuit includes
 a series connection circuit including a temperature detection element and a first resistance element, and
 a current bypass circuit including:
  a bipolar type current bypass transistor, the current bypass circuit being connected in parallel to the temperature detection element and allowing a bypass current to flow, and
  a resistance voltage divider circuit that generates a bias voltage for the current bypass transistor, and
the temperature detection signal is outputted from a connecting part of the temperature detection element and the first resistance element.

18. The power amplifier circuit according to claim 1, wherein
the temperature detector circuit includes
 a series connection circuit including a temperature detection element and a first resistance element connected in series to the temperature detection element, and
 a current bypass circuit including:
  a bipolar type current bypass transistor, the current bypass circuit being connected in parallel to the temperature detection element and allowing a bypass current to flow, and
  a resistance voltage divider circuit that generates a bias voltage for the current bypass transistor, and
 a signal output terminal connected to a node on a path connecting the temperature detection element and the first resistance element.

19. The power amplifier circuit according to claim 3, wherein
the temperature detector circuit includes
 a series connection circuit including a temperature detection element and a first resistance element connected in series to the temperature detection element, and
 a current bypass circuit including:
  a bipolar type current bypass transistor, the current bypass circuit being connected in parallel to the temperature detection element and allowing a bypass current to flow, and
  a resistance voltage divider circuit that generates a bias voltage for the current bypass transistor, and
 a signal output terminal connected to a node on a path connecting the temperature detection element and the first resistance element.

20. The power amplifier circuit according to claim 4, wherein
the temperature detector circuit includes
 a series connection circuit including a temperature detection element and a first resistance element connected in series to the temperature detection element, and
 a current bypass circuit including:
  a bipolar type current bypass transistor, the current bypass circuit being connected in parallel to the temperature detection element and allowing a bypass current to flow, and
  a resistance voltage divider circuit that generates a bias voltage for the current bypass transistor, and
 a signal output terminal connected to a node on a path connecting the temperature detection element and the first resistance element.

* * * * *

UNITED STATES PATENT AND TRADEMARK OFFICE
CERTIFICATE OF CORRECTION

PATENT NO. : 11,456,707 B2
APPLICATION NO. : 16/724894
DATED : September 27, 2022
INVENTOR(S) : Shunsuke Kobayashi et al.

It is certified that error appears in the above-identified patent and that said Letters Patent is hereby corrected as shown below:

In the Specification

Column 2, Line 14, "FIG. 2A are circuit" should be -- FIG. 2A and FIG. 2B are circuit --.

Signed and Sealed this
Fourth Day of July, 2023

*Katherine Kelly Vidal*

Katherine Kelly Vidal
*Director of the United States Patent and Trademark Office*